US005485010A

United States Patent [19]
Owen et al.

[11] Patent Number: 5,485,010
[45] Date of Patent: Jan. 16, 1996

[54] THERMAL ISOLATION STRUCTURE FOR HYBRID THERMAL IMAGING SYSTEM

[75] Inventors: Robert A. Owen, Rowlett; Charles M. Hanson, Richardson, both of Tex.

[73] Assignee: Texas Instruments Incorporated, Dallas, Tex.

[21] Appl. No.: 182,868

[22] Filed: Jan. 13, 1994

[51] Int. Cl.⁶ ................................................. G01J 5/10
[52] U.S. Cl. ..................... 250/332; 250/338.2; 250/338.3
[58] Field of Search ............................. 250/338.2, 338.3, 250/332

[56] References Cited

U.S. PATENT DOCUMENTS

| | | | |
|---|---|---|---|
| 3,962,578 | 6/1976 | Roschen | 250/226 |
| 4,085,500 | 4/1978 | Hager et al. | 437/142 |
| 4,143,269 | 3/1979 | McCormack et al. | 250/352 |
| 4,319,135 | 3/1982 | Steinhage | 250/332 |
| 4,411,732 | 10/1983 | Wotherspoon | 156/643 |
| 4,447,291 | 5/1984 | Schulte | 156/643 |
| 4,614,957 | 9/1986 | Arch et al. | 257/188 |
| 4,639,756 | 1/1987 | Rosbeck et al. | 257/442 |
| 4,663,529 | 5/1987 | Jenner et al. | 250/338 |
| 4,684,812 | 8/1987 | Tew et al. | 348/164 |
| 4,948,976 | 8/1990 | Baliga et al. | 250/370.06 |
| 4,965,649 | 10/1990 | Zanio et al. | 257/442 |
| 5,015,858 | 5/1991 | Augustine et al. | 250/352 |
| 5,047,644 | 9/1991 | Meissner et al. | 250/332 |
| 5,077,474 | 12/1991 | Nix et al. | 250/332 |
| 5,113,076 | 5/1992 | Schulte | 250/370.06 |
| 5,144,138 | 9/1992 | Kinch et al. | 250/332 |
| 5,188,970 | 2/1993 | York et al. | 437/3 |
| 5,286,975 | 2/1994 | Ogura et al. | 250/338.3 |

*Primary Examiner*—Constantine Hannaher
*Attorney, Agent, or Firm*—Brian A. Carlson; James C. Kesterson; Richard L. Donaldson

[57] ABSTRACT

A mesa-type structure (52) is formed from polyimide (or a similar polymer material) to achieve a supporting structure for mounting a focal plane array (30 and 130) on an integrated circuit substrate (70 and 170). In an exemplary thermal imaging system (20 and 120), a thermal isolation structure (50 and 150) is disposed on an integrated circuit substrate (70 and 170) for electrically connecting and mechanically bonding a corresponding focal plane array (30 and 130) of thermal sensors (40 and 140). Each mesa-type structure (52 and 152) initially includes a polyimide mesa (54) over which is formed a reinforcing layer (56 and 156) and a metal conductor (58, 158 and 168) that extends from the top of the mesa-type structure (52 and 152) to an adjacent contact pad (72, 172 and 174). After the focal plane array (30 and 130) is bonded to the corresponding array of mesa-type structures (52 and 152), the polyimide mesas (54) are removed to create void spaces (60 and 160). The resulting mesa-type structures (52 and 152) provide a thermally isolated, but electrically conductive path between the sensor signal electrode (44 and 144) of each thermal sensor (40 and 140) and the corresponding contact pad (72 and 172) on the integrated circuit substrate (70 and 170).

19 Claims, 3 Drawing Sheets

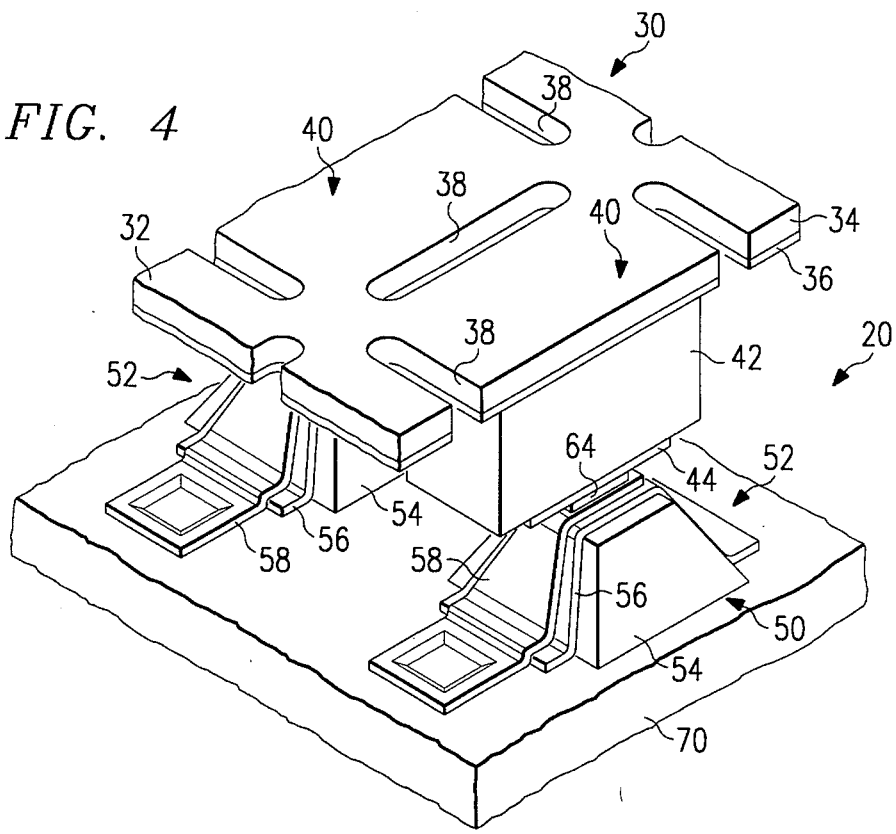
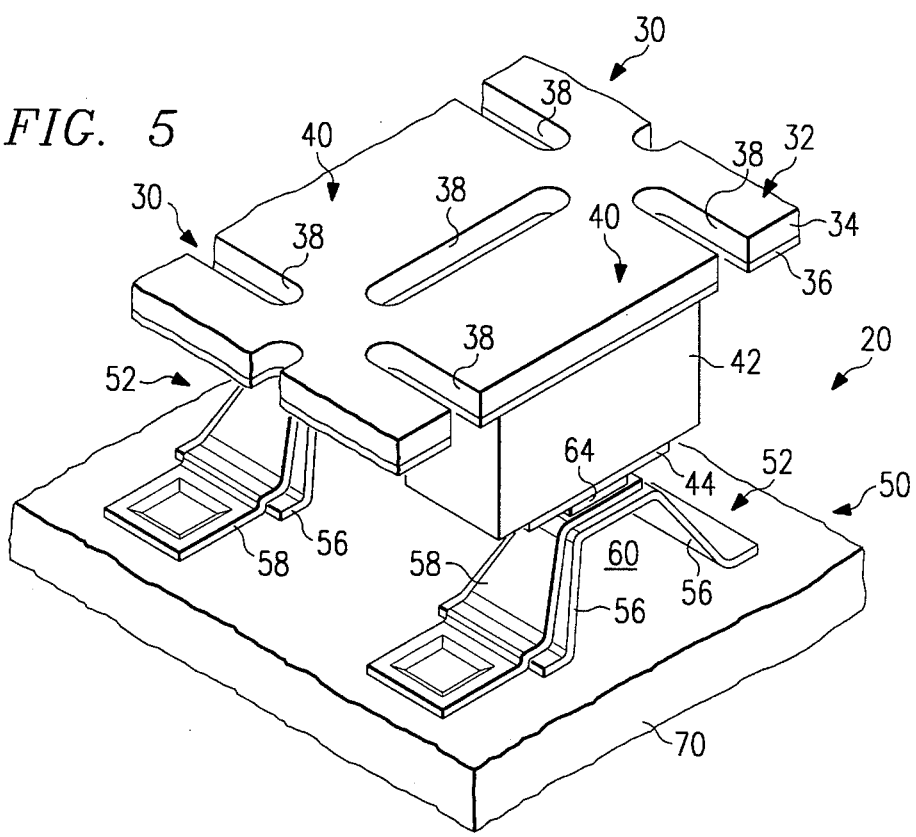

THERMAL ISOLATION STRUCTURE FOR HYBRID THERMAL IMAGING SYSTEM

TECHNICAL FIELD OF THE INVENTION

This invention relates to a thermal isolation structure for hybrid solid state systems, and more particularly to thermal (infrared) imaging systems and methods of fabrication.

BACKGROUND OF THE INVENTION

One common application for thermal sensors is in thermal (infrared) imaging devices such as night vision equipment. One such class of thermal imaging devices includes a focal plane array of infrared detector elements or thermal sensors coupled to an integrated circuit substrate with a corresponding array of contact pads between the focal plane array and the integrated circuit substrate. The thermal sensors define the respective picture elements (or pixels) of the resulting thermal image.

One type of thermal sensor includes a ferroelectric or pyroelectric element formed from ferroelectric material that exhibits a state of electrical polarization dependent upon temperature changes in response to thermal radiation. An infrared absorber and common electrode are disposed on one side of the ferroelectric elements. A sensor signal electrode is disposed on the opposite side of each ferroelectric element. The infrared absorber and common electrode typically extends across the surface of the focal plane array and are attached to each of the ferroelectric elements. Each ferroelectric element typically has its own separate sensor signal electrode. Each infrared detector element or thermal sensor is defined, in part, by the infrared absorber and common electrode and the respective sensor signal electrode, which constitute capacitive plates, and the ferroelectric element, which constitutes a dielectric or insulator disposed between the capacitive plates.

To maximize thermal response and enhance thermal image accuracy, each ferroelectric element of the focal plane array is preferably isolated thermally from the integrated circuit substrate to insure that the sensor signal associated with each thermal sensor accurately represents incident infrared radiation. Thermal isolation structures are typically disposed between the focal plane array and the integrated circuit substrate to provide both mechanical bonding and a sensor signal flow path while minimizing thermal diffusion from the respective thermal sensor to the integrated circuit substrate.

Several approaches have been used to provide a thermal isolation structure between an array of thermal sensors and an underlying integrated circuit substrate. One approach is disclosed in U.S. Pat. No. 4,663,529 entitled Thermal Imaging Device and a Method of Manufacturing a Thermal Imaging Device to Jenner, et al., in which a square grid of channels form a corresponding grid of pillars that define thermal sensor elements. Each pillar or sensor includes a central bore that is coated with a conductive layer. The conductive bores are dimensioned to be less in diameter than corresponding electrode bumps disposed on an integrated circuit substrate, such that when the focal plane array of pillars is disposed over an integrated circuit substrate with a corresponding array of electrode bumps, the conductive bore of each thermal sensor rests on, and is electrically connected to, a corresponding electrode bump. A disadvantage of this architecture is that mating the array of conductive-bore pillars with the corresponding electrode bump array requires close tolerances and exact alignment. Another disadvantage of this architecture is that photoresist is used as the structural material for the pillars, which are therefore structurally fragile and susceptible to damage by solvents.

Another approach is disclosed in U.S. Pat. No. 4,143,269 entitled Ferroelectric Imaging System to McCormack, et al., assigned to Texas Instruments Incorporated, the assignee of this invention, which includes a thermal isolation structure for a thermal sensor array having conductive vias formed in a thermal isolation layer (polyimide) that covers an integrated circuit substrate. In this architecture, vias are formed in the thermal isolation layer, exposing contact pads on the integrated circuit substrate. The sensor signal electrode for a thermal sensor is brought into contact with a corresponding conductive via, providing an electrical connection to the associated contact pad. A disadvantage of this architecture is that so much polyimide is present that total thermal resistance is relatively low. In addition, this architecture requires a relatively large number of process steps, thereby increasing costs.

A further approach to providing a thermal isolation structure having thermal isolation mesas formed from polyimide is shown in U.S. Pat. No. 5,047,644 entitled Polyimide Thermal Isolation Mesa for a Thermal Imaging System to Meissner, et al., assigned to Texas Instruments Incorporation, the assignee of this invention.

SUMMARY OF THE INVENTION

In accordance with the present invention, the disadvantages and problems associated with previous thermal isolation structures used to mechanically and/or electrically couple component structures of a solid state system have been substantially reduced or eliminated. The present invention allows fabricating hybrid devices such as thermal (infrared) imaging systems having a focal plane array mechanically and electrically coupled to an associated integrated circuit substrate with enhanced thermal isolation by providing an array of mesa-type structures with thermally isolating void spaces formed between the focal plane array and the integrated circuit substrate.

The present invention improves thermal isolation between mechanically and/or electrically coupled component structures of a hybrid solid state system by providing a relatively robust mesa-type structure for use during bonding of the component structure and providing thermally insulating void spaces in the mesa-type structure following the bonding operations. The mesa-type structure may be formed on and project from one of the component structures of the hybrid system.

An important technical advantage of the present invention includes improved thermal isolation provided by a bonding and sensor signal interface having selected void spaces between each thermal sensor and an underlying integrated circuit substrate. Enhanced thermal isolation allows reducing the thickness of the ferroelectric element associated with each thermal sensor while maintaining a relatively high temperature change within the ferroelectric element in response to incident infrared radiation. For some applications, the thickness of the thermal isolation structure may also be reduced while maintaining the desired amount of thermal isolation between the thermal sensors and the integrated circuit substrate. A thermal isolation structure incorporating the present invention allows improving the signal-to-noise ratio associated with each thermal sensor and improving the overall net performance of the thermal imaging system, while at the same time, reducing the thickness of the ferroelectric element associated with each thermal sensor. A thermal isolation structure incorporating the present invention may be fabricated in relatively few process steps.

In one aspect of the present invention, the thermal isolation structure may be used in a thermal imaging system to couple an array of thermal sensors to an integrated circuit substrate having a corresponding array of contact pads on the surface of the integrated circuit substrate adjacent to mesa-type supporting structures formed between each thermal sensor and the integrated circuit substrate. An array of mesa-type structures, each formed from selected polymer material, initially project from the integrated circuit substrate surface adjacent to the array of contact pads. Each mesa-type structure includes a mesa conductor for providing a signal path from the top of each mesa to the associated contact pad. The focal plane array may be disposed over the integrated circuit substrate in contact with the respective mesa-type structures such that, for each thermal sensor, the sensor signal output is coupled through a respective mesa conductor to the associated contact pad. After bonding the thermal sensors with their respective mesa-type structure, portions of the mesa-type structure may be removed by chemical etching to provide the desired void spaces for enhanced thermal isolation.

In accordance with another aspect of the present invention, the thermal isolation mesa-type structure for a thermal imaging system is initially formed from a polyimide material with a silicon dioxide shell. Alternative configurations may include a polyimide mesa structure formed with sloped sidewalls or vertical sidewalls adjacent a respective contact pad of a circuit substrate, and a mesa-to-substrate signal path provided by a mesa-strip conductor formed over the top of the mesa and down one sidewall, extending over the adjacent integrated circuit contact pad. For any of these configurations, the polyimide portion of the mesa-type structure may be removed by etching techniques to produce void spaces with high resistance to thermal energy transfer after the thermal sensors have been mechanically and electrically bonded with the integrated circuit substrate.

The thermal imaging system of the present invention includes a focal plane array of ferroelectric thermal sensors, including an infrared absorber and common electrode and individual sensor signal electrodes. The focal plane array is preferably coupled to the circuit substrate by bump-bonding, with a bump-bonding conductive material (such as a bump-bonding metal) being provided on the top of each mesa-type structure and/or on each sensor signal electrode. A plurality of openings may be provided through the infrared absorber and common electrode for use in selective etching techniques to form the desired void spaces in the mesa-type structure.

The polyimide portion of the mesa structure may be fabricated using photolithography techniques and either photosensitive or non-photosensitive polyimide. One fabrication method is to use photosensitive polyimide, forming the mesa structures by patterning a layer of polyimide on photoresist, and then developing the polyimide to remove the unexposed portions, leaving the polyimide portion of the mesa structure with the desired configuration and array. After curing, a thin layer of suitable material such as silicon dioxide may be formed on the exterior of the polyimide mesa using standard photolithography techniques. The mesa conductors may then be formed in conventional metal deposition procedures on the exterior of the silicon dioxide layer. After the bonding operation has been completed between the focal plane array and the integrated circuit substrate, the remaining polyimide portion of the mesa-type structure may be removed by using selected etching techniques.

Other important technical advantages of the mesa-type structures of the present invention include initially forming the mesa-type structures from a polyimide (or other polymer) material to provide mechanical support during the bonding process. The polyimide material is preferably resistant to solvents. The use of thermal isolation mesa-type structures allows flexibility in designing mesa and signal path configurations.

BRIEF DESCRIPTION OF THE DRAWINGS

For a more complete understanding of the present invention, and for further features and advantages, reference is now made to the following description, taken in conjunction with the accompanying drawings, in which:

FIG. 4 is an isometric drawing in elevation with portions broken away showing portions of a thermal imaging system having a focal plane array formed from a plurality of thermal sensors with ferroelectric elements and an integrated circuit substrate with the mesa-type thermal isolation structure of FIGS. 2 and 3;

FIG. 5 is an isometric drawing with portions broken away showing the thermal imaging system of FIG. 4 after portions of the mesa-type thermal isolation structure have been removed by etching techniques to form selected void spaces;

DETAILED DESCRIPTION OF THE INVENTION

Figure 1:
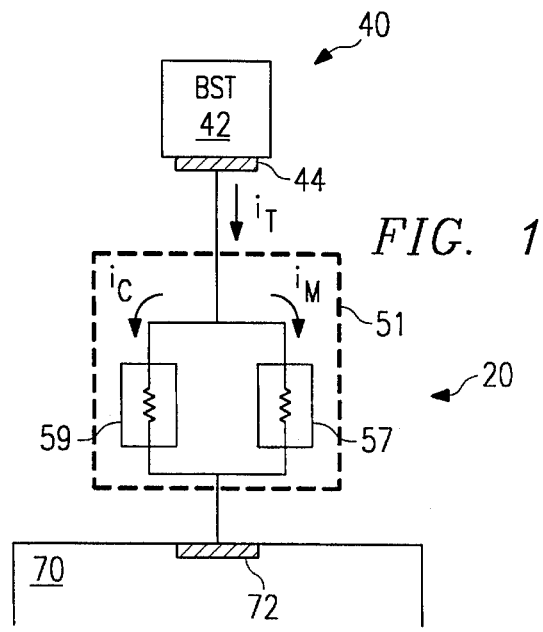
FIG. 1 is a schematic representation of a thermal circuit associated with a thermal imaging system including a focal plane array of thermal sensors formed from ferroelectric elements, an integrated circuit substrate and a thermal isolation structure disposed therebetween.

The preferred embodiments of the present invention and its advantages are best understood by referring to FIGS. 1–7 of the drawings, like numerals being used for like and corresponding parts of the various drawings.

Infrared detectors or thermal imaging systems are typically based upon either the generation of a change in voltage due to a change in temperature resulting from incident infrared radiation striking a thermal sensor or the generation of a change in voltage due to a photon-electron interaction within the material used to form the thermal sensor. This latter effect is sometimes called the internal photoelectric effect. Thermal imaging systems 20 and 120, which will be described later in more detail, function based upon the generation of a change in voltage due to a change in temperature of ferroelectric material resulting from the incident infrared radiation.

One embodiment of the present invention is shown in connection with infrared detector or thermal imaging system 20. Some of the principal components or structures which comprise thermal imaging system 20 include focal plane array 30, thermal isolation structure 50, and integrated circuit substrate 70. Focal plane array 30 comprises a plurality of thermal sensors 40. The quantity and configuration of thermal sensors 40 depend upon the desired N X M focal plane array. The various components of thermal imaging system 20 are preferably contained in a housing (not shown) in a vacuum environment. Void spaces 60 provided by thermal isolation structure 50 are particularly affected with respect to providing thermal isolation in a vacuum environment.

Thermal isolation structure 50 is used to provide mechanical support during bonding of focal plane array 30 with integrated circuit substrate 70 to thermally insulate focal plane array 30 from integrated circuit substrate 70 and to provide a sensor signal interface between thermal sensors 40 in focal plane array 30 and integrated circuit substrate 70. The sensor signal interface allows integrated circuit substrate 70 to process thermal images based on incident infrared radiation detected by focal plane array 30. Thermal isolation structure 50 of the present invention may be readily adaptable to an hybrid solid state system which will benefit from enhanced thermal isolation.

Various types of semiconductor materials and integrated circuit substrates may be satisfactory used with the present invention. U.S. Pat. No. 4,143,269 entitled *Ferroelectric Imaging System* provides information concerning infrared detectors fabricated from ferroelectric materials and a silicone switching matrix or integrated circuit substrate. U.S. Pat. No. 4,143,269 is incorporated by reference for all purposes in this application.

Thermal imaging system 20, as shown in FIGS. 1 through 5, will produce a thermal image in response to incident infrared radiation striking focal plane array 30. The principal components of focal plane array 30 include infrared absorber and common electrode assembly 32 and a plurality of thermal sensors 40. Each thermal sensor 40 further comprises ferroelectric element 42 and sensor signal electrode 44 associated with each ferroelectric element 42. One side of each ferroelectric element 42 is attached to infrared absorber and common electrode assembly 32. Each sensor signal electrode 44 is attached to the opposite side of its associated ferroelectric element 44.

Incident infrared radiation will produce a temperature change in ferroelectric elements 42 which changes the electrical polarization of the respective ferroelectric elements 42. The representative thermal image signal appearing on each sensor signal electrode 44 will depend upon the polarization and capacitance of the associated ferroelectric element 42, which in turn is a function of the incident infrared radiation. The thermal image signal from each thermal sensor 40 in the focal plane array 30 is individually coupled to integrated circuit substrate 70 through respective mesa-type structures 52 provided by thermal isolation structure 50. Each thermal sensor 40 is preferably electrically connected through its associated mesa-type structure 52 to a corresponding contact pad 72 on integrated circuit substrate 70.

The thermal isolation structure associated with hybrid solid state systems often comprises two elements—an electrical signal conductor element and a thermal isolation element. This general configuration for a thermal isolation structure can be represented by a thermal circuit with two parallel thermal current paths, one through the low-thermal-resistivity electrical signal conductor and one through the high-thermal-resistivity thermal isolation element. One of the design goals is to minimize total thermal current flow to maximize the thermal response of the respective ferroelectric element 42 of each thermal sensor 40.

As shown in FIG. 1, thermal isolation structure 50 is represented as thermal circuit 51 connected between sensor signal electrode 44, and the associated contact pad 72. A thermal current $i_T$ flows through thermal circuit 51 corresponding to thermal isolation structure 50, in two parallel thermal current paths—a conductor component $i_c$ flows through a mesa strip conductor 58 having thermal resistance 59, and a mesa component $i_M$ which flows through mesa shell 56 and void space 60 represented by thermal resistance 57. Mesa shell 56 may sometimes be referred to as thin shell 56 or reinforcing film layer 56. The design goal is to maximize the total thermal resistance presented by thermal isolation structure 50, thereby minimizing the total thermal current $i_T = i_c + i_M$.

The thermal current through a material depends upon the thermal conductivity of the material and the volume of material (thermal capacitance). For mesa-type structure 52, mesa shell 56 and void space 60 exhibit very low thermal conductivity (i.e., very high thermal resistivity). The size of each mesa-type structure 52 will be dictated primarily by structural and thermal capacitance considerations, so that the thermal-current mesa component $i_M$ through each mesa-type structure 52 will typically be dictated primarily by structural requirements that determine the minimum allowable size of each mesa-type structure 52.

Mesa strip conductor 58 which provides the sensor signal flow path will inevitably exhibit a relatively low thermal resistivity, and therefore a relatively high thermal conductivity. Accordingly, to increase the total thermal resistance provided by mesa strip conductor 58 and to minimize the corresponding thermal current conductor component $i_c$, mesa strip conductor 58 should be configured with as small a cross sectional area to length ratio as possible.

The recommended design approach is to first specify structural, sensor signal flow path and thermal isolation requirements for thermal isolation structure 50, which will determine its total area and volume. Next the configuration for mesa-type structures 52 is selected and the associated thermal resistance established along with the corresponding thermal-current mesa component $i_m$. Once this thermal current component is established, a configuration for mesa strip conductor 58 and mesa shell 56 may be selected to achieve an overall thermal resistance that meets the thermal isolation requirements for thermal imaging system 20.

Design selection is typically a reiterative process during which the configuration of mesa shell 56, void space 60 and mesa trip conductor 58 are varied to produce the desired structural integrity, sensor signal flow path, and thermal isolation. The presence of void spaces 60 often allows reducing the overall thickness of thermal isolation structure 50 as compared to a thermal isolation structure having solid mesas without voids 60. Also, thermal isolation structure 50 allows reducing the thickness of ferroelectric elements 42 which reduces manufacturing costs, while at the same time maintaining or improving the signal to noise ratio, and reducing MTF losses associated with the resulting thermal sensor.

As shown in FIG. 4, thermal imaging system 20 includes focal plane array 30 of individual thermal sensors or infrared detector elements 40, together with an integrated circuit substrate 70 that includes a corresponding array of signal contact pads 72. Thermal isolation structure 50 comprises an array of mesa-type structures 52, formed on integrated circuit substrate 70 adjacent to respective contact pads 72. Thermal isolation structure 50 provides mechanical support during bonding of focal plane array 30 with integrated circuit substrate 70, sensor signal connection between each thermal sensor 40 and its associated contact pad 72 and thermal isolation between focal plane array 30 and integrated circuit substrate 70.

Each thermal sensor 40 includes a ferroelectric element 42 formed from a suitable ferroelectric material, such as BST (barium-strontium-titanate). Infrared absorber and common electrode assembly 32 and sensor signal electrode 44 are disposed on opposing surfaces of ferroelectric element 42. Infrared absorber and common electrode assembly 32 comprises layer of infrared absorber or optical coating 34 formed from infrared absorber material and metal electrode or reflective plate 36. Metal electrode 36 performs several important functions including supplying voltage to one side of each ferroelectric element 42 and reflecting incident infrared radiation to increase the interaction with optical coating 34. Metallic bump-bonding material for providing bump-bond 64 to an associated mesa-type structure 52 is preferably attached to each sensor signal electrode 44.

For each thermal sensor 40, ferroelectric element 42, infrared absorber and common electrode assembly 32 and the respective sensor signal electrode 44 define a ferroelectric transducer. That is, the metal electrode 36 of the infrared absorber and common electrode assembly 32 and the respective sensor signal electrodes 44 constitute capacitor plates, while the ferroelectric material 42 constitutes a dielectric. The resulting capacitors are temperature-dependent, implementing a ferroelectric (or pyroelectric) transducer function.

For each thermal sensor 40, thermal (infrared) radiation incident to focal plane array 30 is absorbed by the infrared absorber 34 and transmits heat through metal electrode 36 into the adjacent ferroelectric element 42. The resulting temperature change in ferroelectric element 42 causes a change in the state of electrical polarization and a change in capacitance. The corresponding sensor signal output available from the sensor signal electrode 44 depends upon the temperature-dependent polarization and capacitance of the respective ferroelectric transducer (i.e., thermal sensor 40).

The integrated circuit substrate 70 comprises a conventional switching matrix and associated series of amplifiers. Integrated circuit substrate 70 is bonded to focal plane array 30, with each contact pad 72 being electrically connected to the associated sensor signal electrode 44 of a corresponding thermal sensor 40. Thermal isolation structure 50 prevents the integrated circuit substrate 70 from acting as a heat sink for the thermal energy stored in ferroelectric elements 42 of thermal sensors 40 and adversely affecting the associated sensor signal accuracy.

Each polyimide mesa 54 is formed adjacent an associated contact pad 72. Mesa strip conductor 58 provides a signal path between the top of each mesa-type structure 52 and the adjacent contact pad 72. Recommended materials for the mesa strip conductors 58 include titanium and tungsten alloys because of their relatively low thermal conductivity and ease of application.

Bump-bond metal 62 is preferably formed on the top of each mesa-type structure 52, i.e., over the top portion of the mesa strip conductor 58. Bump-bonding metal 62 is selected to be compatible with bump-bonding metal (not shown) on the sensor signal electrode 44. Conventional bump-bonding procedures may be used to provide a good conductive bond 64 between the signal sensor electrode 44 of each thermal sensor element 40, and mesa strip conductor 58 of the corresponding mesa-type structure 52, resulting in good sensor signal connections between each thermal sensor 40 and the associated contact pad 72.

Indium bump bonding techniques have been satisfactorily used to form metal bond 64 between focal plane array 30 and thermal isolation structure 50. The configurations of the polyimide mesa 54 and the associated mesa strip conductor 58 are design choices, largely dependent upon thermal isolation and structural rigidity considerations. Alternative configurations for mesa 54 include a mesa with sloping sidewalls (described below), and a mesa with vertical sidewalls. For sloped-sidewall mesa 54, a mesa strip configuration for the conductor 58 is recommended, while for a vertical-sidewall mesa, a mesa-contour configuration as shown in U.S. Pat. No. 5,047,644 may be more appropriate. These configurations are exemplary only, and other configurations for both the mesa-type structure 52 and the mesa strip conductor 58 will be apparent to those skilled in the art. In particular, while mesa-type structure 52 is shown as symmetrical in horizontal and vertical cross section, such symmetry is not required.

The thermal isolation structure 50 of the present invention is readily adaptable to thermal imaging systems in general to provide a thermally insulating bonding and sensor signal interface between a focal plane array of thermal sensors and the associated integrated circuit substrate. Moreover, mesa-type structure 52 of the present invention has general applicability for various hybrid solid state systems.

Figure 2:
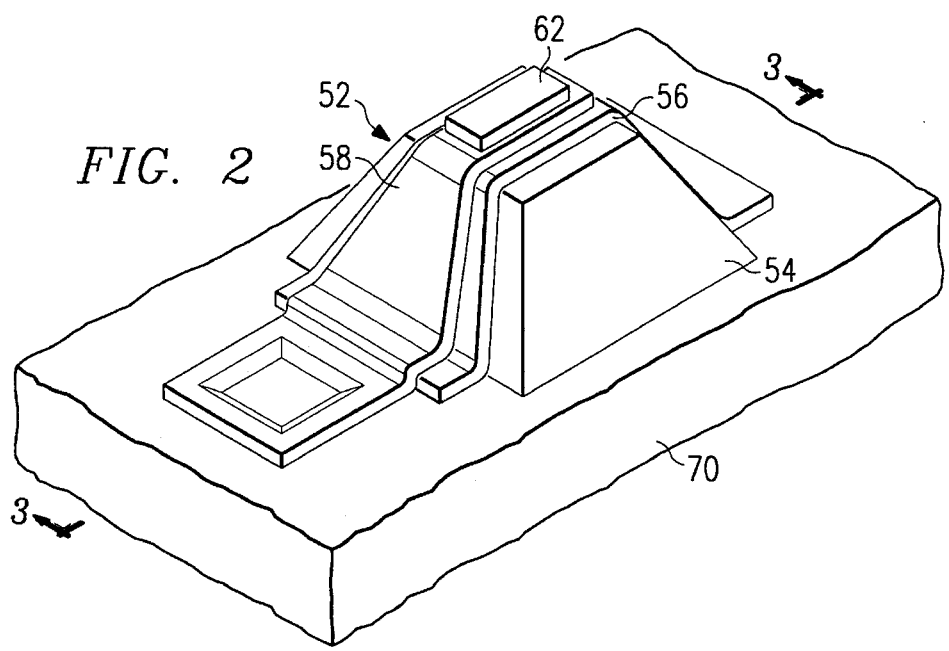
FIG. 2 is an isometric drawing with portions broken away showing a thermal isolation structure having a mesa with sloped sidewalls and a mesa strip conductor for electrically connecting the top of the mesa to an associated contact pad on an integrated circuit substrate.
Figure 3:
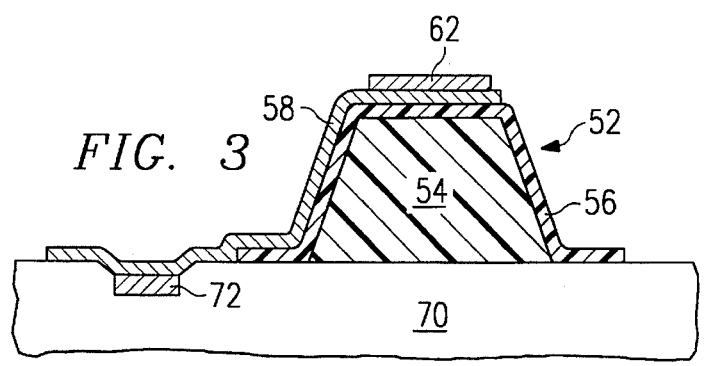
FIG. 3 is a drawing in section with portions broken away taken along line 3—3 of FIG. 2.

FIGS. 2 and 3 show enlarged elevation and section views of mesa-type structure 52 which provides a portion of thermal isolation structure 50 in accordance with the present invention. The mesa-type structures 52 of the present invention, including the exemplary thermal isolation structure 50 for thermal imaging system 20, are fabricated using conventional photolithographic techniques. Fabrication methods using photosensitive polyimide are described. However, for some applications, non-photosensitive polyimide may be used. Fabrication using photosensitive polyimide is recommended, because it generally requires fewer process steps.

The first step is to apply the polyimide (photosensitive or non-photosensitive) to integrated circuit substrate 70 by spinning substrate 70 to flow the polyimide over the substrate to a uniform thickness. For the recommended fabrication method using photosensitive polyimide, the polyimide is then exposed using a mask that patterns the polyimide layer. The exposed polyimide is developed using an appropriate solvent to remove the non-exposed polyimide, leaving the patterned array of polyimide mesas 54 (each adjacent to a respective contact pad 72 on integrated circuit substrate 70). The desired sidewall configuration may be determined by appropriate exposure and development techniques. The assembly is then cured in an appropriate heat-curing process to stabilize and harden the desired array of polyimide mesas 54. Mesas 54 may be formed from other suitable materials in addition to polyimide.

Using conventional photolithography techniques, a layer of silicon dioxide or other suitable material may be placed over mesas 54. The silicon dioxide layer is then removed using conventional organic etch chemistry to provide a thin shell 56 of silicon dioxide material having a thickness of 1000 to 2000 Å extending over at least a portion of each polyimide mesa 54. The principal function of shell 56 is to provide reinforcement for the associated mesa strip conductor 58 so that the physical dimension of the mesa strip conductor may be minimized to reduce the associated thermal current ($i_c$). See FIG. 1. Various configurations of polyimide mesa 54 and thin shell 56 may be used in addition to the configuration shown in FIGS. 2–5.

Once the array of polyimide mesas 54 and associated thin shells 56 has been defined, the selected mesa strip conductors 58 are formed using conventional photolithography techniques on the exterior of each shell 56. Mesa strip conductors 58 may be formed by either an etch process or a lift process using patterned photoresist. Mesa strip conductors 58 are formed on the exterior of each shell 56 to extend from the top of the respective mesa-type structure 52 to the adjacent contact pad 72.

Additional fabrication steps may be employed to deposit bump-bond metals 62 or conductive epoxies (not shown) to the top of a mesa-type structure 52 as desired. These additional fabrication steps are accomplished conventionally, with conventional materials the selection of which depends upon the specific application for thermal isolation structure 50 of the present invention.

The thickness of the metal layers used to form the mesa strip conductors 58 is selected to provide conductors of a predetermined thickness corresponding to the conductor configuration selected and to achieve a selected conductor thermal resistance, as previously described.

Infrared absorber and common electrode assembly 32 is preferably formed with a plurality of openings or elongated slots 38 extending through both infrared absorber layer 34 and reflective plate 36. For the embodiment of the present invention shown in FIGS. 4 and 5, openings 38 are sometimes referred to as "etch access ports."

Openings 38 in infrared absorber and common electrode assembly 32 are important elements of the present invention. Focal plane array 30 may be bonded to integrated circuit substrate 70 by using bump bonding or other conventional techniques to mount focal plane array 30 on thermal isolation structure 50. During this bonding process, polyimide mesas 54 provides the necessary mechanical support for the selected bonding process as shown in FIG. 4.

Following the bonding of focal plane array 30 with integrated circuit substrate 70, various techniques may be used to remove polyimide mesas 54 and to create void space 60 within each thin shell 56. Openings 38 in infrared absorber and common electrode assembly 32 allow various isotropical etches to remove polyimide mesas 54 and form the resulting void spaces 60. For some applications, plasma etching may be the preferred technique to remove polyimide mesa 54. For other applications, various wet etching techniques may be satisfactorily used. Other photolithographic techniques may be selected to form void spaces 60 depending upon the type of material used to form mesas 54. The removal of polyimide mesas 54 to create voids 60 greatly increases the thermal resistance of mesa-type structure 52 and reduces the associated thermal current $i_M$. See FIG. 1.

The precise structural configuration, and associated fabrication method, of mesa-type structures 52 in accordance with this invention are significantly dependent upon the application chosen for the resulting thermal isolation structure 50. Even within a particular application, such as the exemplary thermal imaging systems 20 and 120, numerous design choices will be routinely implemented by those skilled in the art.

Figure 6:
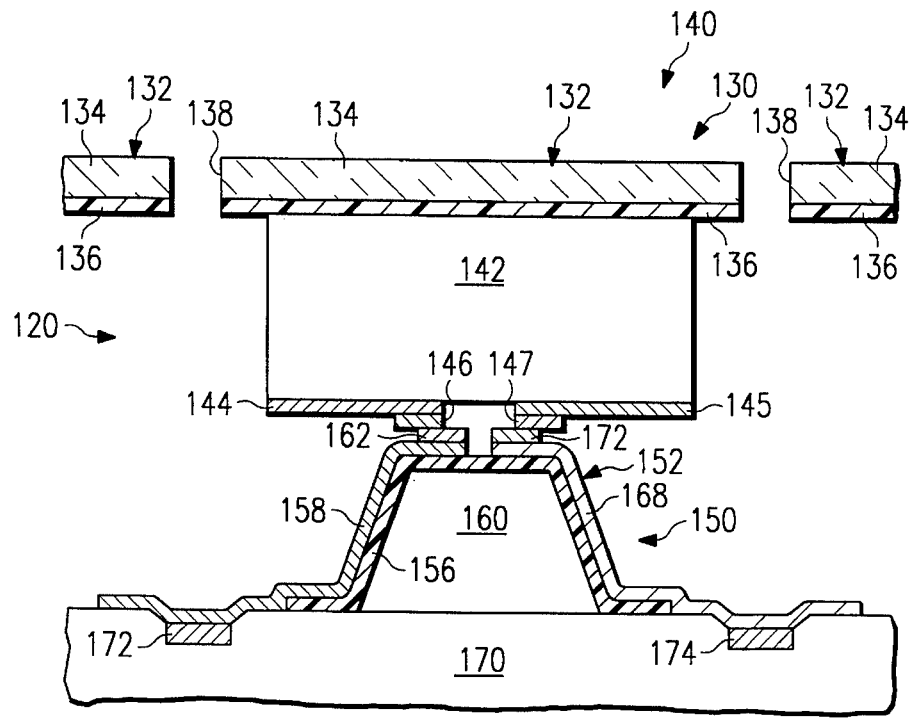
FIG. 6 is a drawing in section with portions broken away showing a thermal imaging system having a focal plane array and a mesa-type thermal isolation structure incorporating an alternative embodiment of the present invention.
Figure 7:
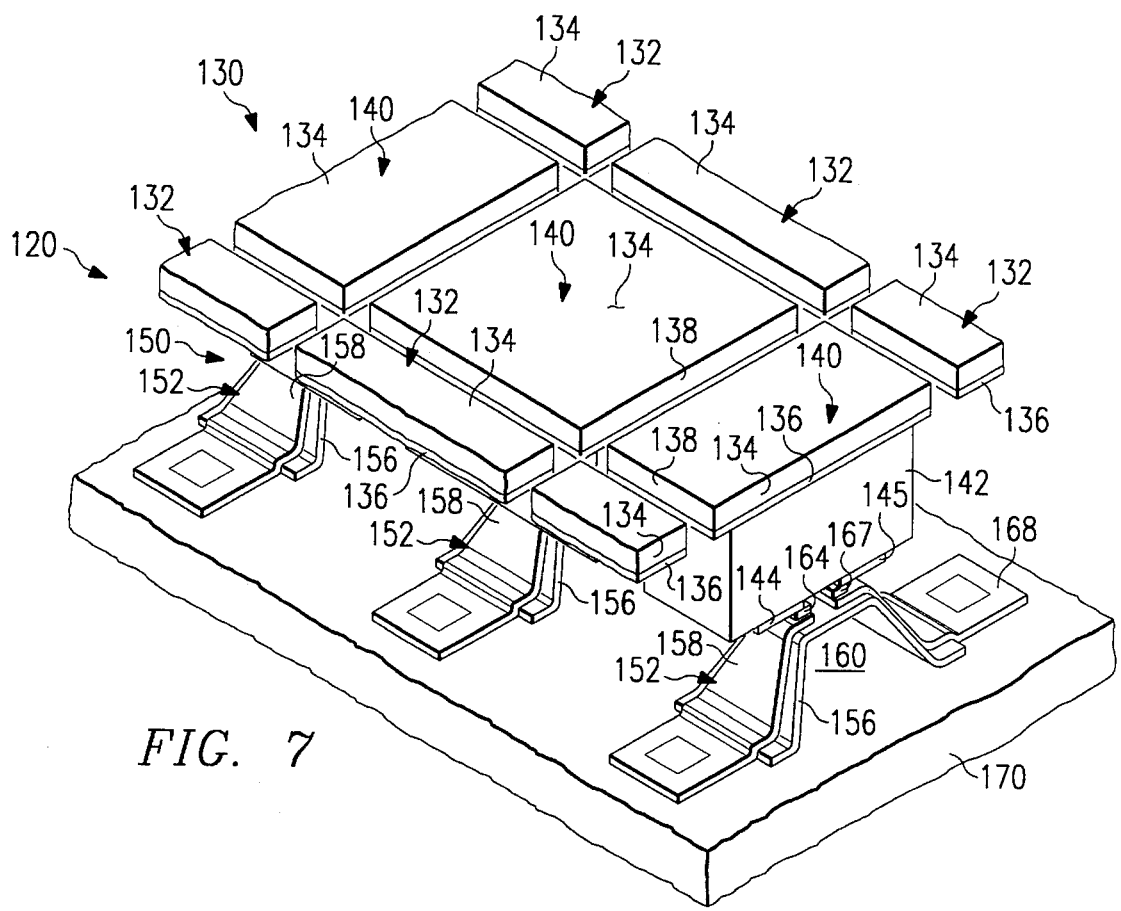
FIG. 7 is an isometric drawing with portions broken away showing the thermal imaging system of FIG. 6.

FIGS. 6 and 7 illustrate an alternative embodiment of the present invention in which thermal imaging system 120 comprises focal plane array 130, thermal isolation structure 150 and integrated circuit substrate 170. As previously noted for thermal imaging system 20, the various components of thermal imaging system 120 are preferably operated in a vacuum environment.

Focal plane array 130 comprises a plurality of thermal sensors 140. Infrared absorber and common electrode assembly 32 of thermal imaging system 20 has been replaced by a plurality of individual, discrete infrared absorber and reflective plate assemblies 132.

By forming focal plane array 130 with discrete infrared absorber and reflective plate assemblies 132, thermal conduction between adjacent thermal sensors 140 is further reduced which improves MTF for thermal imaging system 120. Thermal isolation structure 150 has been modified to provide two electrical contacts 158 and 168 to each thermal sensor 140.

Each infrared absorber and reflective plate assembly 132 comprises a layer of optical coating 134 and a reflective plate 136. A plurality of slots 138 are formed around the exterior of each infrared absorber and reflective plate assembly 132 to separate each assembly 132 from adjacent assemblies 132. Since infrared absorber and reflective plate assemblies 132 are not connected with each other, bias voltage ($V_B$) cannot be applied to each ferroelectric element 142 through common electrode 36 as used in thermal imaging system 20. For the embodiment of the present invention shown in thermal imaging system 120, plate 136 is provided to support optical coating layer 134 and to reflect incident infrared radiation to increase the interaction with optical coating 134. Plate 136 is not used to provide bias voltage ($V_B$) to the ferroelectric transducer representative by ferroelectric element 142.

The ferroelectric transducer or capacitor associate with each thermal temperature sensor 140 is defined in part by bias voltage electrode 145, ferroelectric element 142 and signal sensor electrode 144. Bias voltage electrode 145 and signal sensor electrode are disposed on the same side of ferroelectric element 142 but separated from each other. Therefore, ferroelectric element 142 functions as a dielectric with respect to electrodes 144 and 145.

Integrated circuit substrate 70 provides two electrical contact pads 172 and 174. A pair of mesa strip conductors 158 and 168 are provided on each mesa-type structure 152. Mesa strip conductor 168 provides bias voltage ($V_B$) from contact 174 to allow ferroelectric element 142 and electrodes 144 and 145 to function as a capacitor.

Thermal isolation structure 150 with mesa-type structures 152 and void spaces 160 are formed in a manner similar to thermal isolation structure 50. Slots 138 provide access to mesa-types structures 152 to allow forming void spaces 160 using the desired photolithographic techniques. One of the principal differences includes the use of second mesa strip conductor 168 to provide bias voltage to electrode 145 and bump bonding metal 147 on electrode 145 joined with bump bonding metal 172 on the top of mesa-type structure 152.

Although the present invention has been described with respect to a specific, preferred embodiment, various changes and modifications may be suggested to one skilled in the art, and it is intended that the present invention encompass such changes and modifications as fall within the scope of the appended claims.

What is claimed is:

1. An infrared detector including a focal plane array and an integrated circuit substrate, comprising:

a plurality of openings extending through the focal plane array;

a plurality of thermal sensors for providing a sensor signal output representative of the amount of thermal radiation incident to the focal plane array;

an array of signal contact pads, disposed on the integrated circuit substrate, for receiving the sensor signal output from the respective thermal sensors;

a thermal isolation structure formed by a plurality of mesa-type structures each having a void space, and the mesa-type structures projecting from the integrated circuit substrate adjacent to each signal contact pad for mounting the focal plane array on the integrated circuit substrate;

a layer of reinforcing film formed in part from silicon dioxide for partially defining the void space associated with each mesa-type structure; and a mesa strip conductor disposed on a portion of the exterior of the layer of reinforcing film.

2. The detector of claim 1, wherein the focal plane array further comprises:

each thermal sensor coupled with an infrared absorber and common electrode assembly; and the plurality of openings extending through the infrared absorber and common electrode assembly intermediate the thermal sensors.

3. The detector of claim 1, wherein the focal plane array further comprises:

an infrared absorber and common electrode assembly having a layer of optical coating sensitive to infrared radiation disposed on a layer of reflective material;

each thermal sensor having a ferroelectric element with the common electrode coupled with one side of each ferroelectric element and a signal sensor electrode coupled with the opposite side of the respective ferroelectric element; and the plurality of openings extending through the layer of optical coating and the layer of reflective material intermediate the ferroelectric element of each thermal sensor.

4. The detector of claim 1, wherein the plurality of thermal sensors further comprises:

a plurality of respective ferroelectric elements with each ferroelectric element coupled to a respective infrared absorber and reflective plate assembly disposed on one side of the respective ferroelectric elements and a sensor signal electrode disposed on the opposite side of each ferroelectric element; and each infrared absorber and reflective plate assembly separated from adjacent infrared absorber and reflective plate assemblies.

5. The detector of claim 1, wherein each thermal sensor further comprises:

an infrared absorber and reflective plate assembly having a layer of optical coating sensitive to infrared radiation disposed on a layer of reflective material;

a ferroelectric element with the respective infrared absorber and reflective plate assembly coupled with one side of the ferroelectric element and a sensor signal electrode coupled with the opposite side of the respective ferroelectric element;

a bias voltage electrode coupled with the opposite side of the ferroelectric element spaced from the sensor signal electrode; and each infrared absorber and reflective plate assembly separated from adjacent infrared absorber and reflective plate assemblies.

6. A focal plane array including an array of thermally insulating mesa-type structures, comprising:

an array of thermal sensors for detecting incident thermal radiation, each sensor providing a sensor signal output representative of the amount of the thermal radiation incident to the respective sensor;

an integrated circuit substrate having an array of signal contact pads disposed on a substantially planar surface for receiving the sensor signal outputs from the respective thermal sensors;

an array of mesa-type structures with void spaces, projecting from the substantially planar surface of the integrated circuit substrate, at least one mesa-type structure being disposed adjacent to each signal contact pad;

each mesa-type structure having a layer of reinforcing film formed in part from silicon dioxide to partially define the void space associated with the respective mesa-type structure;

a mesa conductor for providing a signal path between a respective thermal sensor and a corresponding signal contact pad;

each mesa conductor extending from the top of its respective mesa-type structure to an area adjacent the integrated circuit substrate having the corresponding signal contact pad; and the thermal sensor array being disposed over the integrated circuit substrate in contact with the array of thermally insulating mesa-type structures such that, for each, thermal sensor, the sensor signal output is coupled through the respective mesa conductor to the corresponding signal contact pad.

7. The focal plane array of claim 6, wherein the array of thermal sensors further comprises:

an array of individual thermal sensors coupled with an infrared absorber and common electrode assembly; and a plurality of openings extending through the infrared absorber and common electrode assembly intermediate the thermal sensors.

8. The focal plane array of claim 6, wherein the array of thermal sensors further comprises:

an infrared absorber and common electrode assembly having a layer of optical coating sensitive to infrared radiation disposed on a layer of reflective material;

each thermal sensor having a ferroelectric element with the infrared absorber and common electrode assembly coupled with one side of each ferroelectric element and a signal electrode coupled with the opposite side of the respective ferroelectric element; and a plurality of openings extending through the layer of optical coating and the layer of reflective material intermediate the ferroelectric element of each thermal sensor.

9. The focal plane array of claim 6, wherein the mesa-type structures further comprises the associated mesa conductor disposed on a portion of the exterior of each layer of reinforcing film.

10. The focal plane array of claim 6, wherein the array of thermal sensors further comprises:

a plurality of ferroelectric thermal sensors coupled with an infrared absorber and reflective plate assembly disposed on one side of each ferroelectric thermal sensor and a sensor signal electrode disposed on the opposite side of the respective ferroelectric thermal sensor; and each infrared absorber and reflective plate assembly separated from adjacent infrared absorber and reflective plate assemblies.

11. The focal plane array of claim 6, wherein the array of thermal sensors further comprises:

an infrared absorber and reflective plate assembly having a layer of optical coating sensitive to infrared radiation disposed on a layer of reflective material;

each thermal sensor having a ferroelectric element with the infrared absorber and reflective plate assembly coupled with one side of the ferroelectric element and a sensor signal electrode coupled with the opposite side of each respective ferroelectric element;

a bias voltage electrode coupled with the opposite side of each ferroelectric element spaced from the sensor signal electrode; and each infrared absorber and reflective plate assembly separated from adjacent infrared absorber and reflective plate assemblies.

12. A method of fabricating a thermal imaging system having a focal plane array mounted on an integrated circuit substrate with a thermal isolation structure disposed therebetween, comprising the steps of:

forming the focal plane array from a plurality of thermal sensors which provide a sensor signal output representative of thermal radiation incident to the focal plane array;

providing an integrated circuit substrate with an array of signal contact pads for receiving the sensor signal output from the respective thermal sensors;

forming a plurality of mesa-type structures from a first material with the mesa-type structures projecting respectively from the integrated circuit substrate adjacent to each signal contact pad to provide a portion of the thermal isolation structure;

forming a reinforcing layer from a second material on the exterior of each mesa-type structure;

mounting the focal plane array on the thermal isolation structure; and forming a void space within each mesa-type structure adjacent to the respective reinforcing layer.

13. The method of fabricating the system as defined in claim 12, further comprising the step of forming a plurality of longitudinal openings extending through the focal plane array intermediate the respective thermal sensors.

14. The method of fabricating the system as defined in claim 12, further comprising the steps of:

forming the mesa-type structures in part from polyimide and the reinforcing layers from silicon dioxide;

forming a mesa-strip conductor on the exterior of the each layer of reinforcing material; and placing bump bonding material on a portion of each mesa-strip conductor at the top of each mesa-type structure for forming a sensor signal flowpath with the respective thermal sensor.

15. The method of fabricating the system as defined in claim 12, further comprising the steps of:

forming the focal plane array with an infrared absorber and common electrode assembly;

coupling one side of a ferroelectric element associated with each thermal sensor to the infrared absorber and common electrode assembly; and forming a plurality of longitudinal openings in the infrared absorber and common electrode assembly intermediate the ferroelectric elements.

16. The method of fabricating the system as defined in claim 12, further comprising the steps of:

forming a mesa-strip conductor on the exterior of the each layer of reinforcing material;

placing bump bonding material on each mesa-strip conductor for forming a portion of a sensor signal flowpath with an associated thermal sensor; and placing corresponding bump bonding material on each thermal sensor.

17. The method of fabricating the system as defined in claim 12, further comprising the steps of:

forming each thermal sensor with a ferroelectric element;

forming the focal plane array with an infrared absorber and reflective plate assembly;

coupling one side of each ferroelectric element to the infrared absorber and reflective plate assembly;

forming a plurality of longitudinal slots in the infrared absorber and reflective plate assembly intermediate the ferroelectric elements to provide a separate infrared absorber and reflective plate assembly associated with each thermal sensor; and using the longitudinal slots to provide access to the mesa-type structures to form the respective void space using photolithographic techniques.

18. A method of fabricating a thermal imaging system having a focal plane array mounted on an integrated circuit substrate with a thermal isolation structure disposed therebetween, comprising the steps of:

forming the focal plane array from a plurality of thermal sensors which provide a sensor signal output representative of thermal radiation incident to the focal plane array;

providing an integrated circuit substrate with an array of signal contact pads for receiving the sensor signal output from the respective thermal sensors;

forming a plurality of mesa-type structures projecting from the integrated circuit substrate adjacent to each signal contact pad to provide a portion of the thermal isolation structure;

mounting the focal plane array on the thermal isolation structure;

forming a void space in each mesa-type structure;

forming a plurality of longitudinal openings in the focal plane array intermediate each thermal sensor;

forming the mesa-type structures in part with polyimide material;

mounting the focal plane array on the mesa-type structures; and removing the polyimide material within each mesa-type structure to form the void space.

19. A method of fabricating a thermal imaging system having a focal plane array mounted on an integrated circuit substrate with a thermal isolation structure disposed therebetween, comprising the steps of:

forming the focal plane array from a plurality of thermal sensors which provide a sensor signal output representative of thermal radiation incident to the focal plane array;

providing an integrated circuit substrate with an array of signal contact pads for receiving the sensor signal output from the respective thermal sensors;

forming a plurality of mesa-type structures projecting from the integrated circuit substrate adjacent to each signal contact pad to provide a portion of the thermal isolation structure;

mounting the focal plane array on the thermal isolation structure;

forming, a void space in each mesa-type structure;

forming the mesa-type structures in part with polyimide material;

mounting the focal plane array on the mesa-type structures;

forming a plurality of longitudinal slots through the focal plane array intermediate each thermal sensor; and removing the polyimide material within each mesa-type structure to form the void space.

* * * * *